(12) United States Patent
Thompson

(10) Patent No.: US 11,985,759 B2
(45) Date of Patent: May 14, 2024

(54) ELECTRONIC ASSEMBLIES HAVING EMBEDDED PASSIVE HEAT PIPES AND ASSOCIATED METHOD

(71) Applicant: EAGLE TECHNOLOGY, LLC, Melbourne, FL (US)

(72) Inventor: Jason Thompson, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 18/121,780

(22) Filed: Mar. 15, 2023

(65) Prior Publication Data

US 2023/0239994 A1    Jul. 27, 2023

Related U.S. Application Data

(62) Division of application No. 17/315,960, filed on May 10, 2021, now Pat. No. 11,632,854, which is a
(Continued)

(51) Int. Cl.
| | |
|---|---|
| *H05K 1/02* | (2006.01) |
| *F21V 29/00* | (2015.01) |
| *F28D 15/00* | (2006.01) |
| *F28D 15/02* | (2006.01) |
| *F28D 15/04* | (2006.01) |

(Continued)

(52) U.S. Cl.
CPC ....... *H05K 1/0209* (2013.01); *H05K 7/20336* (2013.01); *H05K 2201/064* (2013.01); *H05K 2201/066* (2013.01)

(58) Field of Classification Search
CPC .......... H05K 1/02; H05K 1/0209; H05K 1/18; H05K 1/144; H05K 3/22; H05K 3/282; H05K 7/00; H05K 7/20; H05K 7/20336; H05K 2201/064; H05K 2201/066; H05K 1/0203; H05K 7/20436; F28D 15/00; F28D 15/02; F28D 15/04; F28D 15/0233; F28D 15/0275; F21V 29/00; H01L 23/00; H01L 23/34; H01L 23/40; H01L 23/367; H01L 23/427; H01L 23/467; F28F 1/02; F28F 3/12; F28F 9/266; G06F 1/20
USPC ....... 361/720, 679.34, 679.7, 689, 692, 695, 361/697, 700, 702, 703, 709, 718, 719, 361/679.47; 165/80.2, 80.3, 104.26, 165/104.33, 171, 185; 362/184, 294, 362/294.01, 294.02, 294.06, 373
See application file for complete search history.

(56) References Cited

U.S. PATENT DOCUMENTS

| | | |
|---|---|---|
| 4,638,854 A | 1/1987 | Noren |
| 4,938,280 A | 7/1990 | Clark |
| (Continued) | | |

*Primary Examiner* — Xiaoliang Chen
(74) *Attorney, Agent, or Firm* — ALLEN, DYER, DOPPELT, + GILCHRIST, P.A. Attorneys at a Law

(57) ABSTRACT

An electronic assembly may include a chassis, and electronic modules mounted within the chassis. Each electronic module may include a printed circuit substrate, heat-generating electronic components mounted on the printed circuit substrate, and a heat sink body mounted to the printed circuit substrate and having a plurality of heat pipe receiving passageways extending between opposing side edges and overlying corresponding heat-generating components. A respective elongate, passive, heat pipe may extend within each heat pipe receiving passageway and be removably fastened to at least one end to the heat sink body for enhanced conductive heat transport.

11 Claims, 7 Drawing Sheets

Related U.S. Application Data division of application No. 16/848,940, filed on Apr. 15, 2020, now Pat. No. 11,076,478, which is a division of application No. 16/246,601, filed on Jan. 14, 2019, now Pat. No. 10,667,378.

(51) Int. Cl.

| | |
|---|---|
| *F28F 1/02* | (2006.01) |
| *F28F 3/12* | (2006.01) |
| *G06F 1/20* | (2006.01) |
| *H01L 23/00* | (2006.01) |
| *H01L 23/34* | (2006.01) |
| *H01L 23/367* | (2006.01) |
| *H01L 23/40* | (2006.01) |
| *H01L 23/427* | (2006.01) |
| *H01L 23/467* | (2006.01) |
| *H05K 1/18* | (2006.01) |
| *H05K 3/22* | (2006.01) |
| *H05K 7/00* | (2006.01) |
| *H05K 7/20* | (2006.01) |

(56) References Cited

U.S. PATENT DOCUMENTS

| | | | |
|---|---|---|---|
| 5,268,812 A | 12/1993 | Conte | |
| 5,355,942 A | 10/1994 | Conte | |
| 5,598,320 A * | 1/1997 | Toedtman | G06F 1/203 361/679.55 |
| 6,095,734 A | 8/2000 | Postadan et al. | |
| 6,148,906 A | 11/2000 | Li et al. | |
| 6,166,908 A | 12/2000 | Samaras et al. | |
| 6,181,553 B1 | 1/2001 | Cipolla et al. | |
| 6,256,199 B1 | 7/2001 | Yusuf et al. | |
| 6,385,044 B1 | 5/2002 | Colbert et al. | |
| 6,625,021 B1 | 9/2003 | Lofland et al. | |
| 7,661,466 B2 | 2/2010 | Li et al. | |
| 7,764,500 B2 | 7/2010 | Li et al. | |
| 7,976,188 B2 * | 7/2011 | Peng | F21V 29/717 362/249.02 |
| 9,429,370 B1 | 8/2016 | Thomsen et al. | |
| 10,121,727 B1 | 11/2018 | Lucas et al. | |
| 10,238,043 B1 | 3/2019 | Vardi | |
| 10,721,838 B1 | 7/2020 | Bhatia et al. | |
| 10,736,235 B2 | 8/2020 | Yu et al. | |
| 10,746,475 B2 * | 8/2020 | Roberts | F28D 15/025 |
| 2002/0006029 A1 | 1/2002 | Liu | |
| 2003/0128512 A1* | 7/2003 | Owens | G02B 6/4452 361/689 |
| 2003/0159806 A1 | 8/2003 | Sehmbey et al. | |
| 2004/0123978 A1 | 7/2004 | Hashimoto et al. | |
| 2004/0252502 A1 | 12/2004 | McCullough et al. | |
| 2004/0264142 A1* | 12/2004 | Mejia | H05K 7/20009 257/E23.101 |
| 2005/0083660 A1* | 4/2005 | Lee | G06F 1/20 361/709 |
| 2006/0039117 A1 | 2/2006 | Lee et al. | |
| 2006/0060328 A1 | 3/2006 | Ewes et al. | |
| 2006/0087816 A1 | 4/2006 | Ewes et al. | |
| 2006/0109631 A1 | 5/2006 | Marro et al. | |
| 2006/0243427 A1 | 11/2006 | Kitajima et al. | |
| 2007/0114009 A1 | 5/2007 | Xia et al. | |
| 2007/0144705 A1 | 6/2007 | Chen et al. | |
| 2007/0165374 A1* | 7/2007 | Chen | H01L 23/467 257/E23.099 |
| 2007/0236885 A1* | 10/2007 | Zhao | H01L 23/427 257/E23.088 |
| 2007/0263357 A1 | 11/2007 | Ju | |
| 2008/0035311 A1* | 2/2008 | Hsu | H01L 23/427 165/104.21 |
| 2008/0101027 A1* | 5/2008 | Yu | H01L 23/427 361/709 |
| 2008/0121370 A1* | 5/2008 | Luo | H01L 23/427 257/E23.099 |
| 2008/0123295 A1* | 5/2008 | Wu | H01L 23/4093 257/E23.099 |
| 2008/0174952 A1* | 7/2008 | Ye | H01L 23/4006 361/679.48 |
| 2008/0198554 A1* | 8/2008 | Holmberg | F28D 15/0275 361/709 |
| 2009/0046464 A1* | 2/2009 | Liu | F21K 9/00 362/373 |
| 2009/0147522 A1* | 6/2009 | Shuai | F21V 29/51 362/294 |
| 2009/0151895 A1* | 6/2009 | Liu | H01L 23/427 165/80.2 |
| 2009/0154102 A1 | 6/2009 | Zhou et al. | |
| 2009/0154105 A1* | 6/2009 | Chu | H01L 23/4093 29/890.03 |
| 2009/0159252 A1* | 6/2009 | Lai | H01L 23/427 165/185 |
| 2009/0321050 A1 | 12/2009 | Guo et al. | |
| 2009/0321054 A1* | 12/2009 | Qin | H01L 23/427 165/104.26 |
| 2010/0002394 A1 | 1/2010 | Chen et al. | |
| 2010/0132925 A1 | 6/2010 | Lewis | |
| 2010/0206522 A1 | 8/2010 | Zhou et al. | |
| 2010/0259897 A1 | 10/2010 | Min et al. | |
| 2010/0264800 A1* | 10/2010 | Liu | F21V 29/77 313/46 |
| 2010/0282443 A1 | 11/2010 | Guo et al. | |
| 2011/0075360 A1* | 3/2011 | Tomioka | H05K 7/20336 361/695 |
| 2011/0110042 A1* | 5/2011 | Zhang | F28D 15/0275 165/104.26 |
| 2011/0182033 A1 | 7/2011 | Tissot et al. | |
| 2011/0194578 A1 | 8/2011 | Hirose et al. | |
| 2011/0310605 A1 | 12/2011 | Renn et al. | |
| 2012/0160456 A1 | 6/2012 | Aoki | |
| 2012/0279686 A1 | 11/2012 | Chainer et al. | |
| 2013/0155611 A1 | 6/2013 | Yang et al. | |
| 2013/0213603 A1 | 8/2013 | Connors et al. | |
| 2013/0329368 A1 | 12/2013 | Degner et al. | |
| 2014/0049964 A1* | 2/2014 | McClure | F21V 29/56 362/249.02 |
| 2014/0063731 A1 | 3/2014 | Fang | |
| 2014/0078678 A1* | 3/2014 | Chao | H05K 7/2039 361/720 |
| 2014/0191624 A1* | 7/2014 | Jahshan | H02K 11/33 310/68 B |
| 2014/0238640 A1 | 8/2014 | Arvelo et al. | |
| 2014/0301067 A1* | 10/2014 | Morgan | F21V 19/0055 362/249.02 |
| 2015/0219400 A1* | 8/2015 | Sasaki | F28D 15/0233 165/104.26 |
| 2015/0305200 A1 | 10/2015 | Uesugi et al. | |
| 2015/0318772 A1* | 11/2015 | Jahshan | B60L 50/40 318/400.41 |
| 2016/0212881 A1* | 7/2016 | Saito | H05K 7/20727 |
| 2016/0262290 A1 | 9/2016 | Chen | |
| 2016/0284624 A1* | 9/2016 | Yamada | H01L 23/4338 |
| 2017/0105313 A1* | 4/2017 | Shedd | H05K 7/20309 |
| 2017/0208706 A1 | 7/2017 | Short et al. | |
| 2017/0235349 A1* | 8/2017 | Ghioni | F28D 15/0275 361/679.47 |
| 2018/0042136 A1 | 2/2018 | Sugawara et al. | |
| 2018/0254237 A1 | 9/2018 | Kulkarni et al. | |
| 2019/0014689 A1* | 1/2019 | Yu | F28F 3/12 |
| 2019/0269035 A1* | 8/2019 | Saturley | F28D 15/00 |

* cited by examiner

ELECTRONIC ASSEMBLIES HAVING EMBEDDED PASSIVE HEAT PIPES AND ASSOCIATED METHOD

FIELD OF THE INVENTION

The present invention relates to the field of cooling electronic assemblies containing, but not limited to, printed circuit boards, and more particularly, to cooling dissipating components contained within the chassis of an electronic assembly using heat sinks and passive heat pipes.

BACKGROUND OF THE INVENTION

As electronic packaging density increases and dissipated power increases to achieve higher levels of electronic performance, the need for efficient thermal transport within electronic assemblies having printed circuit boards is increasing. Brute force heat transfer techniques involving forced air, active liquid cooling, and similar heat transport mechanisms have been used to transport heat from sensitive electronic components to heat sinks or similar heat spreading devices. Some heat transfer systems use composite structures, for example, annealed pyrolytic graphite (APG) embedded within metallic skins, or use heat pipes that are physically connected to spreader plates by solder, epoxy, or clamps.

These heat transfer systems have benefits and shortcomings depending on the application and environment. In the case of APG composites, in-plane conductivities are on the order of approximately 800-1000 W/m-K at end of life (EOL), but have much higher values at the beginning of life (BOL). This degradation over time is caused, for example, by thermal cycling. Through-plane conductivity is also a concern for APG composites because graphite is orthotropic, and its through-plane conductivity is much lower because of the orientation of in-plane graphite fibers. Despite this in-plane conductivity being six times that of aluminum and two and a half times that of copper, this conductivity is still inferior to that of a typical water-filled copper heat pipe having greater than 10,000 W/m-K in its vapor space, or about ten times that of graphite.

Most heat pipe applications are received in hemispherical grooves and then flattened for direct contact with high heat generating components. In an active heat transfer system, a condenser end of the heat pipe may terminate to permit heat removal, often via fan convection. This type of active heat dissipation may provide good heat transport, but dedicated heat spreaders or heat sinks are required to reduce thermal gradients and improve the conductive transport between the heat sources and heat sink. This technique, however, is not always practical. The heat pipes are exposed to the elements leading to corrosion and often require complex geometries. Other heat pipe designs require clamps, which can introduce undesirable risks or complexity due to heat pipe deformation with respect to clamp load, integration difficulty, and overall design repeatability. These issues impact performance and reliability of the electronic assembly and their integration to printed circuit boards and associated components.

SUMMARY OF THE INVENTION

In general, an electronic assembly may include a chassis, and a plurality of electronics modules mounted within the chassis. Each electronics module may comprise a printed circuit substrate, a plurality of heat-generating electronic components mounted on the printed circuit substrate, and a heat sink body mounted to the printed circuit substrate. The heat sink body may have opposing ends and opposing side edges extending between the opposing ends, and the heat sink body may have a plurality of heat pipe receiving passageways extending therethrough between opposing side edges and overlying corresponding ones of the heat-generating components. The electronics module may also include a respective elongate, passive, heat pipe extending within each heat pipe receiving passageway and be removably fastened at at least one end to the heat sink body.

Each of the heat-receiving passageways may be continuous so that each elongate, passive, heat pipe is concealed within the heat sink body. The heat sink body may have a plurality of weight relief recesses therein between adjacent heat pipe receiving passageways, for example.

In some embodiments, each heat pipe receiving passageway may include a threaded end portion, and each elongate, passive, heat pipe has a mating threaded end removably fastened to the threaded end portion of a corresponding heat pipe receiving passageway. In other embodiments, the assembly may comprise a respective removable fastener removably fastening each elongate, passive, heat pipe within the corresponding heat pipe receiving passageway.

The heat sink body, in some embodiments, may comprise a 3D printed heat sink body. In other embodiments the heat sink body may comprise a 3D printed heat sink body, and each elongate, passive, heat pipe may comprise a 3D printed heat pipe.

The chassis structure may comprise additional elongate, passive, heat pipes extending therein using integration techniques previously described. In addition, each elongate, passive, heat pipe may comprise a solid rod.

Another aspect is directed to a method for making a thermally enhanced electronics module to be mounted within a chassis. The method may include mounting a plurality of heat-generating electronic components on a printed circuit substrate, and mounting a heat sink body to the printed circuit substrate and having opposing ends and opposing side edges extending between the opposing ends. The heat sink body may have a plurality of heat pipe receiving passageways extending therethrough between opposing side edges and overlying corresponding ones of the heat-generating components. The method also includes removably fastening a respective elongate, passive, heat pipe extending within each heat pipe receiving passageway. The method may include applying a thermal interface material between each heat pipe and the respective heat pipe receiving passageway.

DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
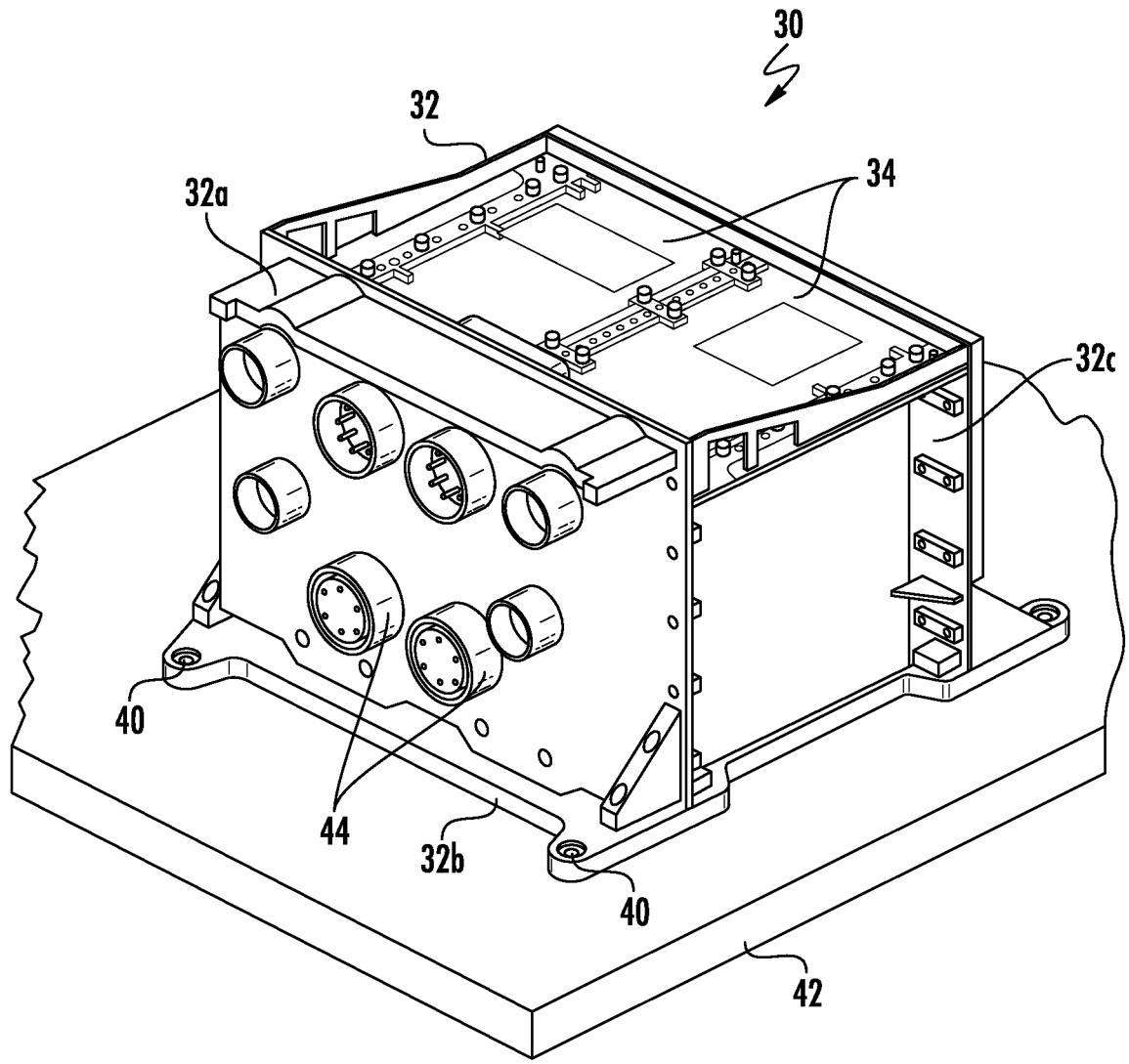
FIG. 1 is an isometric view of an electronic assembly showing electronics modules utilizing printed circuit substrates mounted within its chassis in accordance with an example embodiment.

Referring initially to FIG. 1, an electronic assembly 30 includes a chassis 32 formed as an enclosure having a top wall 32a, bottom wall 32b and side walls 32c. As illustrated, a section of its top wall 32a is removed to show a plurality of electronic modules 34 containing printed circuit boards that are mounted within the chassis 32. In this non-limiting example, the chassis 32 may be formed from different metallic or non-metallic materials, such as aluminum or thermoplastic materials, and is configured to receive electronic modules 34 as a 3U form factor. The illustrated four corner brackets 40 engage a panel or other mounting surface 42 to mount the electronic assembly 30 on the surface as a self-contained unit. The electronic assembly 30 may include different types of connectors contained within its chassis 32, such as a backplane connector or other circuit board connector, to which the printed circuit boards contained within the plug-in electronic modules 34 may interface. Other connectors 44 in this example are positioned on a side wall 32c of the chassis 32 to which cables, wires or other electrical connectors may extend into the chassis 32 and connect to the electronic modules 34.

Figure 2:
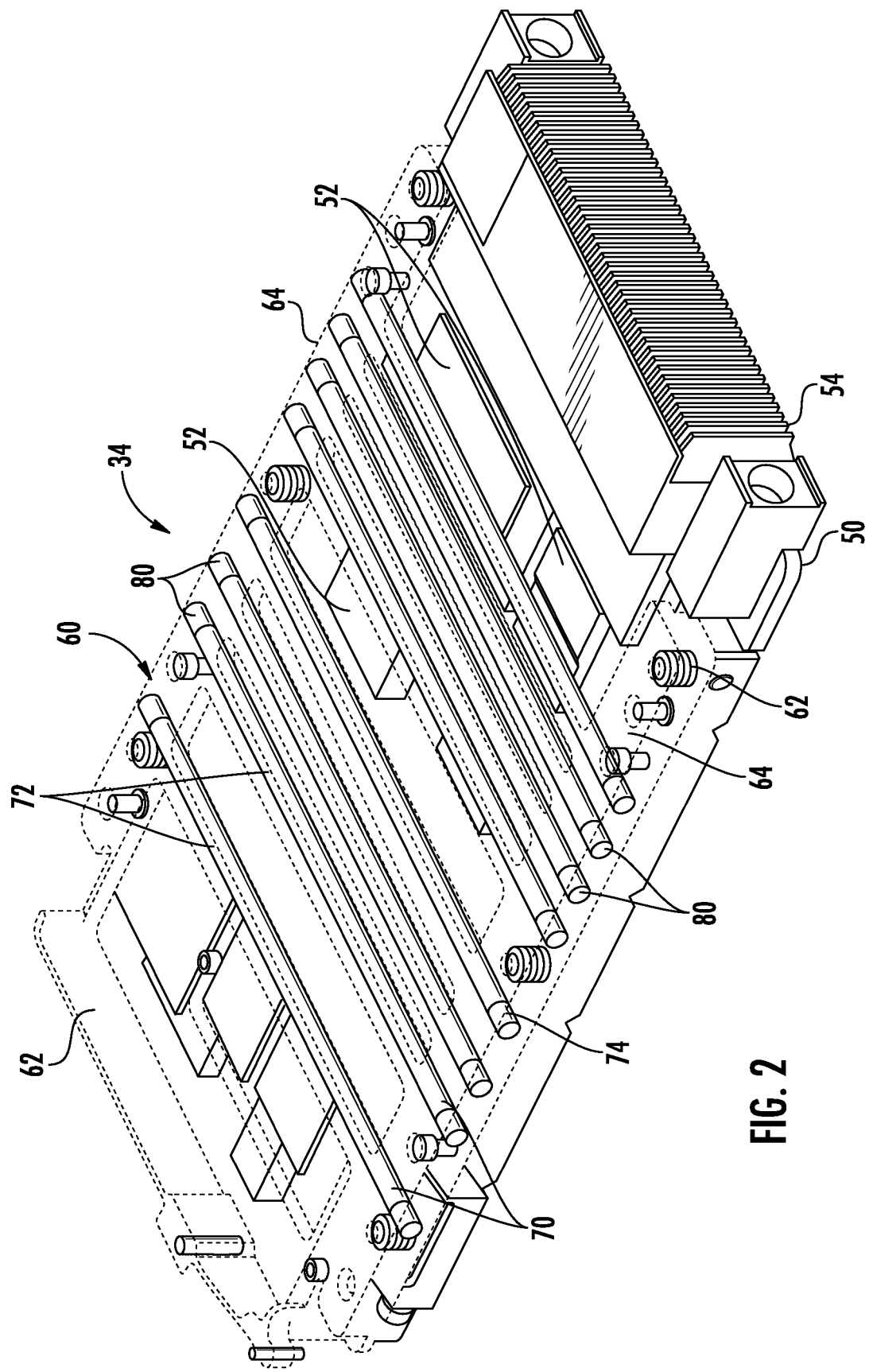
FIG. 2 is an isometric view of the electronics module mounted to a heatsink body and integral to the assembly shown in FIG. 1.
Figure 3:
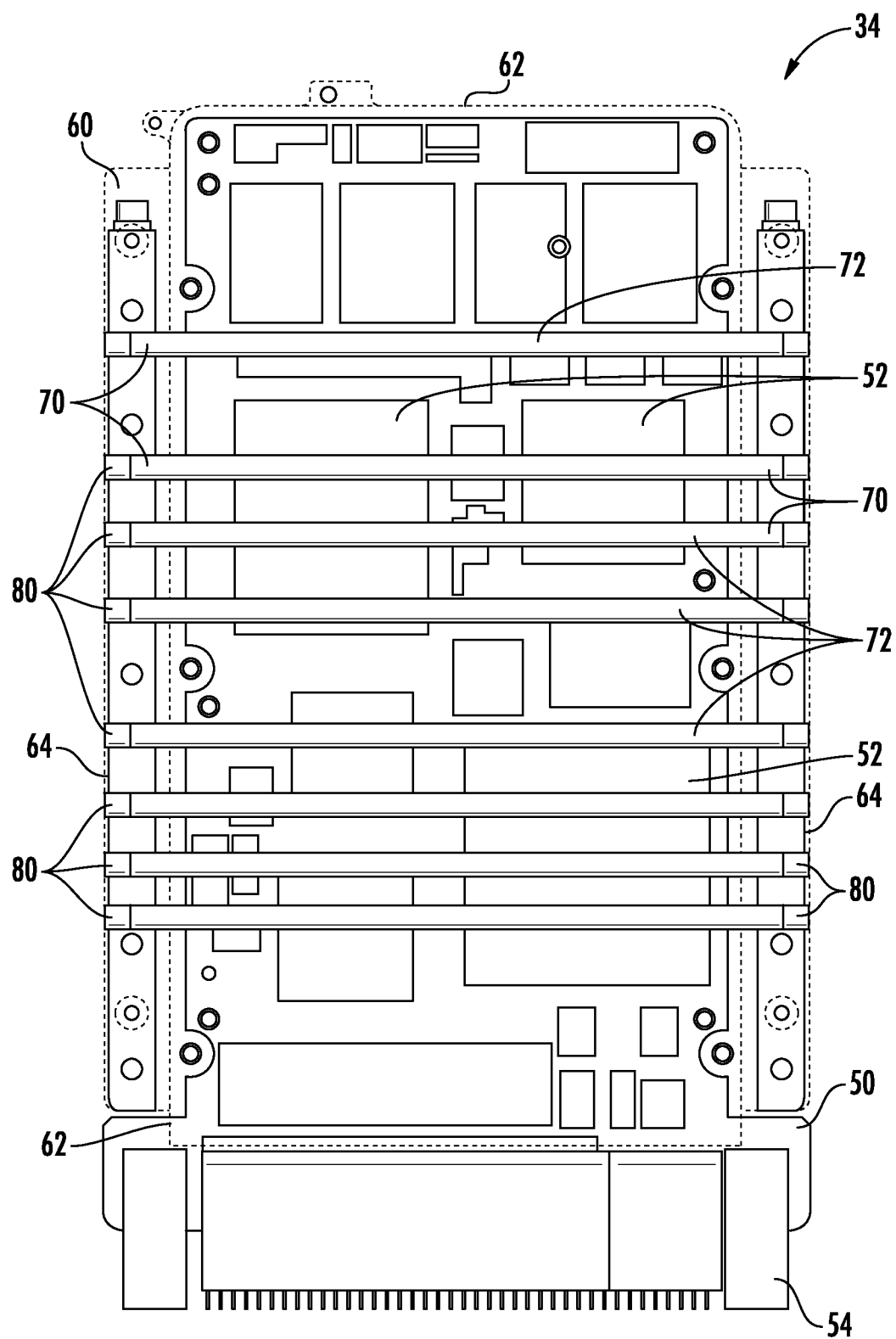
FIG. 3 is a top plan view of the electronics module shown in FIG. 2.
Figure 4:
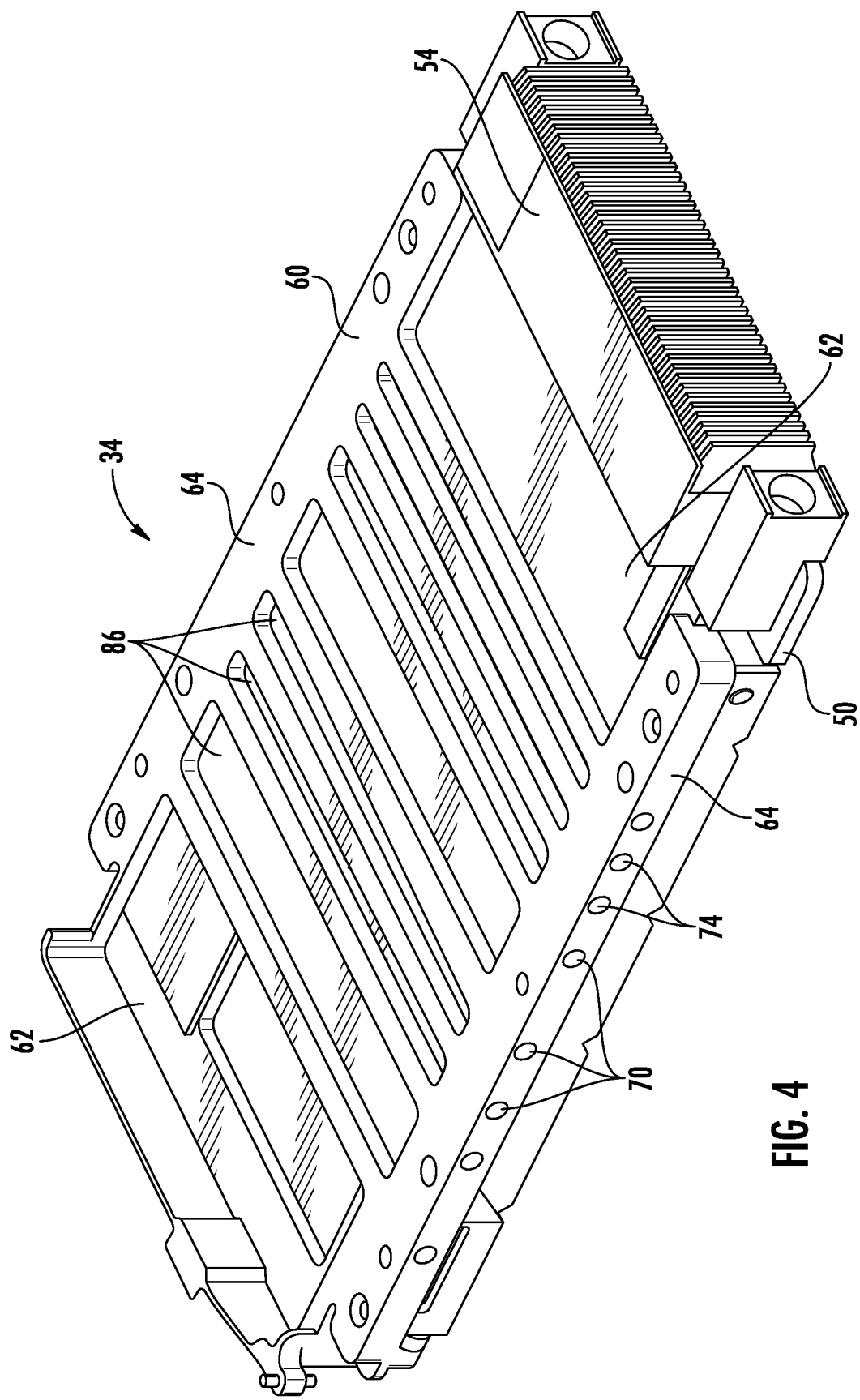
FIG. 4 is an isometric view of the electronics module of FIG. 2 showing weight relief recesses on the heat sink.

Referring now to FIGS. 2-4, there is illustrated an example embodiment of an electronic module 34 as mounted in the chassis 32 of the electronic assembly 30 of FIG. 1. The module 34 includes a printed circuit substrate 50 having a plurality of heat-generating electronic components 52 mounted on the printed circuit substrate as best shown in the plan view of the electronic module in FIG. 3. Such heat-generating electronic components 52 may include microprocessors, field programmable gate arrays (FPGA's), and similar electronic components that generate heat during their operation and are interconnected to each other through vias and electronic circuit traces formed on the printed circuit substrate 50. In this example, a circuit card connector 54 is mounted at the end of the printed circuit substrate 50 and configured to connect the electronic module 34 into a backplane connector or other circuit board connector contained within the chassis 32. The printed circuit substrate 50 can be formed using standard manufacturing techniques known to those skilled in the art. In this example, the printed circuit substrate 50 is designed to conform to the VITA 3U form factor and configured to fit within the illustrated chassis 32. In a non-limiting example, the printed circuit substrate 50 is rectangular configured.

A heat sink body 60 is mounted to the printed circuit substrate 50 and has opposing ends 62 and opposing side edges 64 extending between the opposing ends. The heat sink body 60 can be formed from different heat conductive materials, such as aluminum, but can also be formed as a 3D printed heat sink body using additive manufacturing techniques as will be explained in greater detail below. The heat sink body 60 includes a plurality of heat pipe receiving passageways 70 extending therethrough between opposing side edges 64 and overlying corresponding heat-generating electronic components 52. The passageways 70 may be formed by standard manufacturing processes known to those skilled in the art, including boring or other techniques. A respective elongate, passive heat pipe 72 extends within each heat pipe receiving passageway 70 and is removably fastened at at least one end at the side edge 64 of the heat sink body 60, such as by a heat pipe fastener or close-out attached to an end of a respective heat pipe described below. The heat pipes 72 extend transverse through the heat sink body 60 and overlie the corresponding heat-generating components 52. Each heat-receiving passageway 70 is continuous so that each elongate, passive, heat pipe 72 is concealed within the heat sink body 60. Each heat pipe receiving passageway 70 may include a threaded end portion 74 (FIG. 4) and each elongate, passive, heat pipe 72 has a mating threaded end removably fastened to the respective threaded end portion 74 of the corresponding heat pipe receiving passageway 70. In the illustrated example, the heat pipes may be restrained using a compression plug on both ends as a close-out, or a set screw or similar device. This demonstrates the versatility for installing pipes using separate fastening hardware (e.g., set screws or compression plugs) for mechanical attachment to receiving structure.

Although the illustrated embodiment uses a mating threaded end or compression plug, it is possible that helicoils could be installed to hold the heat pipes 72 or self-tapping fasteners used. It is also possible to press-fit each heat pipe 72 into a passageway 70.

A plurality of interstitial materials, commonly referred to as reworkable thermal interface materials, may be used between the heat pipe and receiving passageway. The use of a material at this interface will reduce the thermal resistance between the heat-generating components and the transport medium, in this case the heat pipe and integral vapor space. Typical materials that can be used are cured and non-curing silicone suspensions, thermal epoxies and greases, solder, and others. Use of an interstitial material does not influence the fastening approach outlined herein and is used as an optional enhancement to the overall thermal management solution.

Each heat pipe may act as a stiffening member in the receiving structure. This provides dual-use mechanical and thermal benefits with extensibility to metal and ceramic matrix composites (MMC and CMCs) where strength to weight ratio must be optimized with thermal transport capability.

Figure 6:
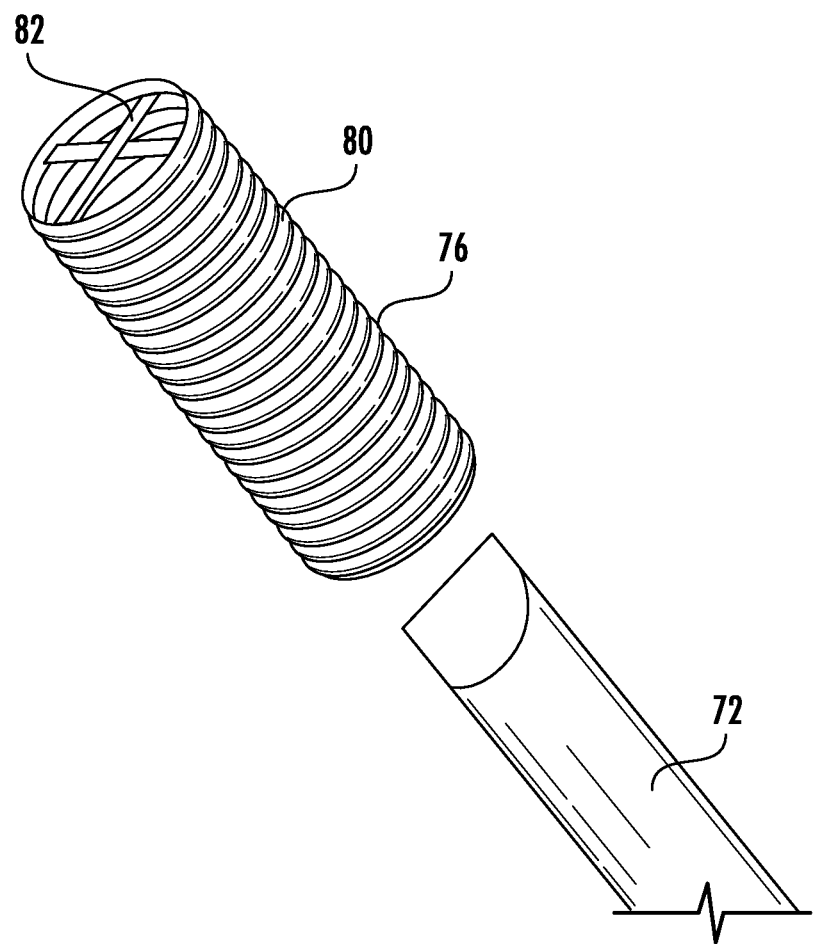
FIG. 6 is an exploded isometric view of a threaded end of the heat pipe shown in FIG. 5.

In a non-limiting example, each electronic module 34 may include a respective removable fastener 80 as a close-out, for example, such as best shown in FIGS. 2, 3 and 6, which removably fastens each elongate, passive heat pipe 72 within a corresponding heat pipe receiving passageway 70. In the example shown in FIG. 6, the fastener 80 may be press-fit onto the end of the heat pipe 72 and may include an end 82 that is configured to receive a tool, allowing a manufacturer to insert the heat pipe into the heat pipe receiving passageway 70 and screw the fastener within the heat pipe receiving passageway, thus locking the heat pipe within the passageway. In another embodiment, the fastener 80 could be bonded or soldered to the heat pipe 72. This removable fastener 80 may be formed as integral threads on the body of the pipe in yet another example.

Each elongate, passive heat pipe 72 may be formed as a hollow or solid rod and constructed from a conductive material, such as, but not limited to, copper or brass. The fasteners 80 may be formed from the same or different material as the heat pipe 72, and in an example, is a separate stainless steel fastener secured onto the end of the passive heat pipe.

The heat sink body 60 preferably includes a plurality of weight relief recesses 86 formed therein between adjacent heat pipe receiving passageways 70 (FIG. 4) as concealed pipe areas and operate to reduce the overall weight of the heat sink body. It is understood that the chassis 32 receives a number of electronic modules 34 to form the electronic assembly 30. The electronic modules 34 with their associated printed circuit substrates 50, heat-generating electronic components 52 and heat sink bodies 60 will add weight to the electronic assembly 30. The weight relief recesses 86 formed in each heat sink body 60 reduce the overall weight of the electronic assembly 30. This weight reduction, even though slight per module 34, becomes important when there are numerous electronic assemblies 30 that operate together in one device or craft. This can be done without any sacrifice to thermal performance due to the efficiency of the thermal transport within the heat pipes vs. additional mass required to lower lateral thermal resistance through a solid material.

Figure 5:
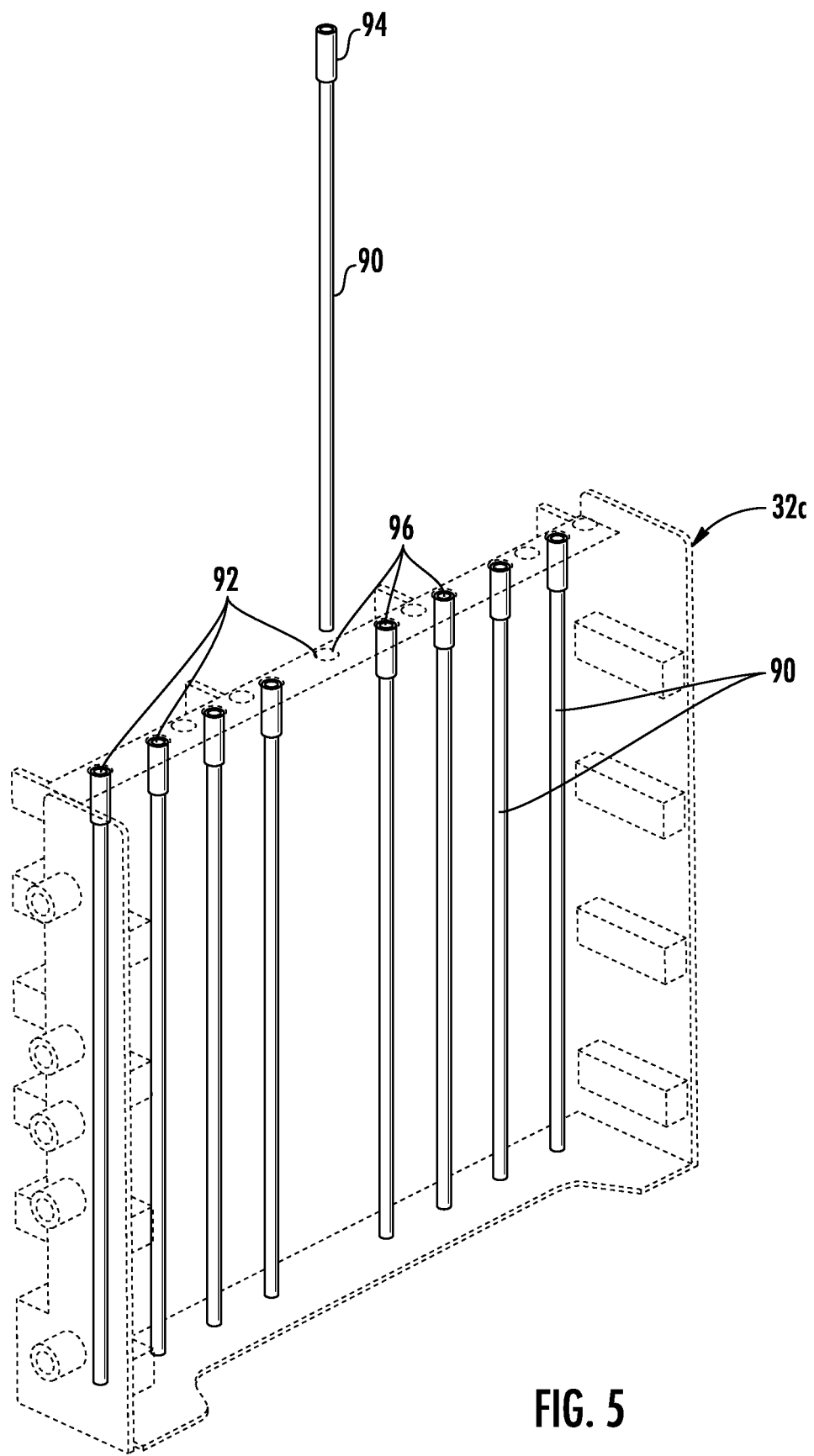
FIG. 5 is an isometric view of a side wall from the chassis of FIG. 1 and showing heat pipes extending therein.

Referring now to FIG. 5, there is illustrated at least one side wall 32c removed from the chassis 32 and having a plurality of elongate, passive heat pipes 90 received within heat pipe receiving passageways 92 that extend vertically within the side wall of the chassis. In this example, the heat pipes 90 received within the side wall 32c are formed similar to those heat pipes 72 received within the passageways 70 of the heat sink body 60, but in this illustrated example, the side wall heat pipes 90 have only one fastener 94 that removably fastens the heat pipe 90 into a threaded end portion 96 of the side wall 32c of the chassis 32. In this example, these "first" heat pipes 90 connected into the chassis side wall 32c may include only one fastener 94, while the "second" heat pipes 72 received within the heat sink body 60 and shown relative to FIGS. 2-4 may include fasteners 80 at both ends such as set screws or other fastener devices.

It has been found that the heat pipes 90 received in the passageways 92 of the side wall 32c of the chassis 32 can reduce temperatures by as much as 10° to 15° C. and may outperform APG composite designs by a factor of five in a 3U form factor as a non-limiting example. This is based on a weight-neutral basis for the material that integrates the heat pipes 90 and which material can be subsequently removed in other areas since the heat transport is handled by the embedded heat pipes and is not dependent upon the material thickness, which would otherwise be required to reduce the lateral thermal resistance.

The heat pipes 72 concealed within the heat sink body 60 and heat pipes 90 concealed within the side wall 32c have no impact on the module form or fit. It has been found that this design as described facilitates fabrication of the electronic modules 34 and permits assembly in under four weeks in a typical design fabrication cycle, versus a 12-16 week lead time for APG and other complicated active heat pipe approaches that require pumps and associated devices for fluid flow.

This design as described provides robustness because the heat pipes 72 are completely concealed in the heat sink body 60, or as in the case of the heat pipes 90, they are concealed in the side wall 32a of the chassis 32. This design provides reworkability since the heat pipes 72,90 may be removed if necessary. The heat pipes 72,90 improve thermal transport capability with additional surface area for heat uptake and transport making the heat pipes easier to integrate into a system instead of a state-of-the-art APG or fluid flow via active heat pipe designs.

Figure 7:
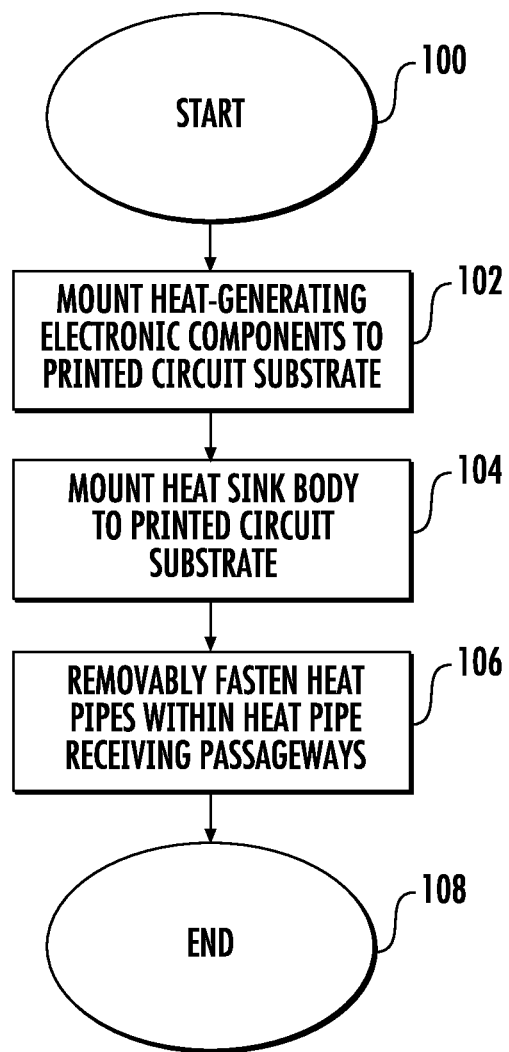
FIG. 7 is a flow diagram illustrating method aspects associated with the assembly of an electronics module consisting of a printed circuit board and embedded heat pipe heatsink body of FIG. 2.

Referring now to FIG. 7, there is illustrated a flowchart for a method of making the electronic modules 34 to be mounted within a chassis 32. The process starts (Block 100) and a plurality of heat-generating electronic components 52 are mounted onto a printed circuit substrate 50 (Block 102).

The heat sink body 60 is mounted to the printed circuit substrate 50, which includes its opposing ends 62 and opposing side edges 64 extending between the opposing ends (Block 104). This heat sink body 60 has a plurality of heat pipe receiving passageways 70 extending therethrough between opposing side edges 64 and overlying corresponding heat-generating electronic components 52. The respective elongate, passive heat pipes 72 extending within each heat pipe receiving passageway 70 may be removably fastened to the heat sink body 60 (Block 106) such as using set screws or other threaded fasteners as an example. The process ends (Block 108).

As noted before, it is possible to form the heat sink body 60 and heat pipes 72 using 3D printing, i.e., using additive manufacturing techniques. Different additive manufacturing techniques may be used to form the 3D printed heat sink body and the associated 3D printed heat pipes. It is possible to use Fused Deposition Modeling (FDM), including a process that feeds filaments of metal wire or other material through an extrusion nozzle head to build various layers. Laser sintering techniques, including selective laser sintering with metals and polymers and direct metal laser sintering, may be employed. It is also possible to use electron beam melting and melt metal powder, layer by layer, using the electron beam while employed in a high vacuum. It is also possible to use stereo lithography techniques with photo polymerization.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making an electronic module to be mounted within a chassis, the method comprising:
   3D printing a heat sink body;
   coupling the 3D printed heat sink body to a plurality of heat-generating electronic components on a circuit substrate, the 3D printed heat sink body having opposing ends and opposing side edges extending between the opposing ends, the 3D printed heat sink body having a plurality of heat pipe receiving passageways extending therethrough between opposing side edges and overlying corresponding ones of the heat-generating components;
   3D printing a plurality of heat pipes; and
   fastening a respective 3D printed heat pipe extending within each heat pipe receiving passageway by threading an end of the respective 3D printed heat pipe into a corresponding heat pipe receiving passageway.

2. The method according to claim 1, wherein each heat pipe receiving passageway is continuous so that each corresponding 3D printed heat pipe is concealed within the 3D printed heat sink body.

3. The method according to claim 1, wherein 3D printing the heat sink body comprises forming at least one weight relief recess adjacent at least one heat pipe receiving passageway.

4. The method according to claim 1, wherein 3D printing the heat sink body comprises forming a plurality of weight relief recesses adjacent the heat pipe receiving passageways.

5. The method according to claim 1, wherein each heat pipe receiving passageway includes a threaded end portion; and wherein each 3D printed heat pipe comprises a mating threaded end for the threaded end portion of a corresponding heat pipe receiving passageway.

6. The method according to claim 1, comprising applying a thermal interface material between each 3D printed heat pipe and the respective heat pipe receiving passageway.

7. The method according to claim 1, wherein fastening the respective 3D printed heat pipe includes attaching a fastener to an end of each 3D printed heat pipe.

8. The method according to claim 1, wherein each 3D printed heat pipe comprises a passive 3D printed heat pipe.

9. The method according to claim 1, wherein 3D printing the heat sink body comprises at least one of Fused Deposition Modeling (FDM), laser sintering, electron beam melting, and stereo lithography.

10. The method according to claim 1, wherein 3D printing the heat plurality of heat pipes comprises at least one of Fused Deposition Modeling (FDM), laser sintering, electron beam melting, and stereo lithography.

11. The method according to claim 1, wherein the plurality of 3D printed heat pipes comprise a material to impart stiffness to the 3D printed heat sink.

\* \* \* \* \*